(12) United States Patent
Sharon

(10) Patent No.: US 10,826,287 B2
(45) Date of Patent: Nov. 3, 2020

(54) METHOD AND SYSTEM PROVIDING FEEDER FAULT RESPONSE

(71) Applicant: S&C Electric Company, Chicago, IL (US)

(72) Inventor: Yoav Sharon, Evanston, IL (US)

(73) Assignee: S&C Electric Company, Chicago, IL (US)

(*) Notice: Subject to any disclaimer, the term of this patent is extended or adjusted under 35 U.S.C. 154(b) by 231 days.

(21) Appl. No.: 16/217,490

(22) Filed: Dec. 12, 2018

(65) Prior Publication Data

US 2019/0245342 A1    Aug. 8, 2019

Related U.S. Application Data

(60) Provisional application No. 62/625,993, filed on Feb. 3, 2018.

(51) Int. Cl.
| | |
|---|---|
| *H02H 7/00* | (2006.01) |
| *H02H 7/26* | (2006.01) |
| *H02H 1/00* | (2006.01) |
| *G01R 31/08* | (2020.01) |

(52) U.S. Cl.
CPC ............ *H02H 7/26* (2013.01); *G01R 31/086* (2013.01); *H02H 1/0007* (2013.01)

(58) Field of Classification Search
None
See application file for complete search history.

(56) References Cited

U.S. PATENT DOCUMENTS

| | | | | |
|---|---|---|---|---|
| 6,426,634 B1* | 7/2002 | Clunn | .................... | H02H 3/044 |
| | | | | 324/522 |
| 7,265,953 B2* | 9/2007 | Hourai | .................. | G01R 31/40 |
| | | | | 361/159 |
| 8,269,503 B2* | 9/2012 | Tremblay | ............. | G01R 31/088 |
| | | | | 324/522 |
| 10,153,635 B2* | 12/2018 | O'Brien | .................. | H02H 7/28 |
| 2007/0211401 A1 | 9/2007 | Mak | | |
| 2012/0203479 A1 | 8/2012 | Yadav et al. | | |
| 2015/0226781 A1 | 8/2015 | Sun et al. | | |
| 2016/0011252 A1 | 1/2016 | Kang et al. | | |

OTHER PUBLICATIONS

International Search Report and Written Opinion dated Jun. 7, 2019 for the International Patent Application No. PCT/US2019/20632. (14 pages).

* cited by examiner

*Primary Examiner* — Stephen W Jackson

(57) ABSTRACT

A method for determining whether a fault is on a feeder line or a lateral line so as to allow an upstream recloser on the feeder line to immediately open in response to the fault if it determines the fault is on the feeder line. The method includes measuring a downstream voltage on the feeder line at a downstream recloser during the fault and transmitting the downstream voltage from the downstream recloser to the upstream recloser. The method can determine that the fault is on the feeder line or the lateral line by determining whether the fault voltage is approximately the same as the downstream voltage, or by comparing a first distance from the upstream recloser to the fault location using the fault voltage and a second distance from the upstream recloser to a last location of the fault current on the feeder line using the downstream voltage.

20 Claims, 1 Drawing Sheet

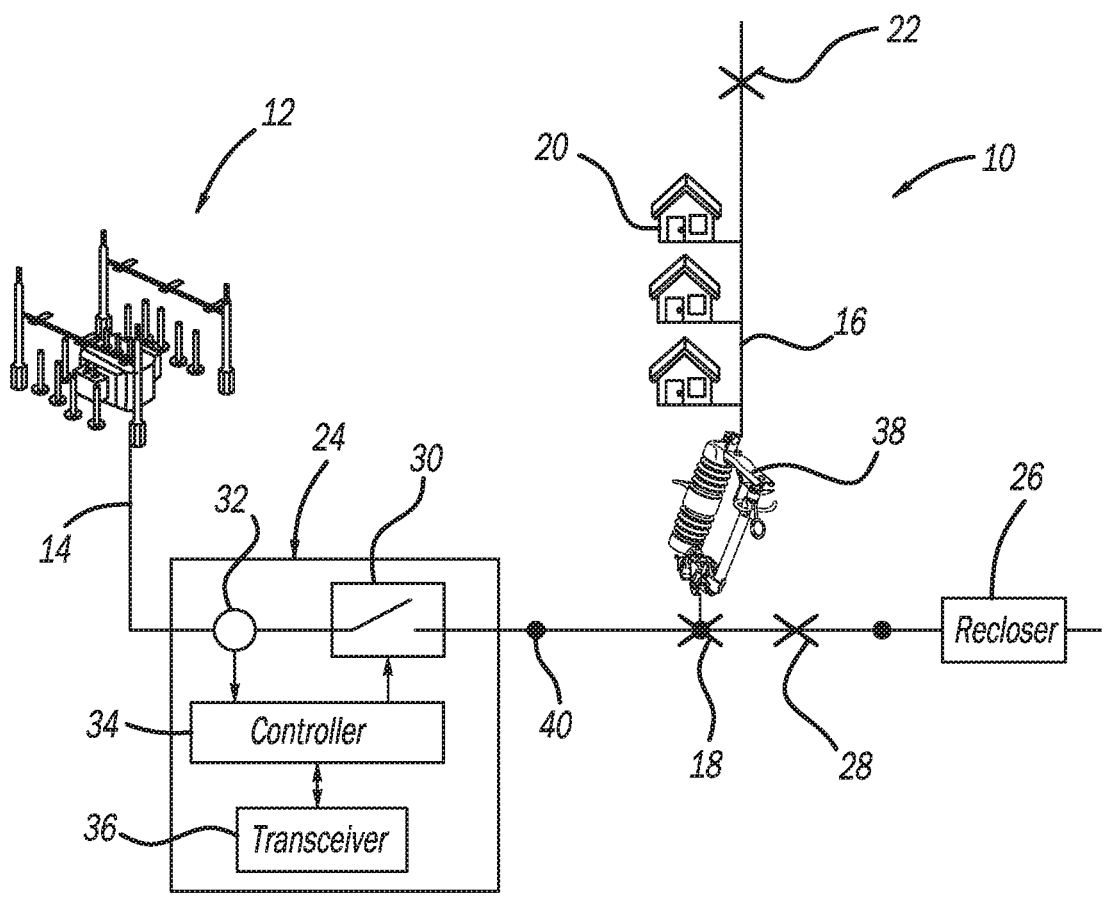

METHOD AND SYSTEM PROVIDING FEEDER FAULT RESPONSE

CROSS-REFERENCE TO RELATED APPLICATION

This application claims the benefit of priority from the U.S. Provisional Application No. 62/625,993, filed on Feb. 3, 2018, the disclosure of which is hereby expressly incorporated herein by reference for all purposes.

BACKGROUND

Field

This disclosure relates generally to a method for determining whether a fault is located on a feeder line or a lateral line in an electrical power distribution network and, more particularly, to a method for determining whether a fault is located on a feeder line or a lateral line in an electrical power distribution network that includes comparing the distance from a recloser to the fault location and the distance from the recloser to the last location on the feeder line that fault current was present to determine if they are the same.

Discussion of the Related Art

An electrical power distribution network, often referred to as an electrical grid, typically includes a number of power generation plants each having a number of power generators, such as gas turbine engines, nuclear reactors, coal-fired generators, hydro-electric dams, etc. The power plants provide a high voltage AC signal on high voltage transmission lines that deliver electrical power to a number of substations typically located within a community, where the voltage is stepped down to a medium voltage. The substations provide the medium voltage power to a number of three-phase feeder lines. The feeder lines are coupled to a number of lateral lines that provide the medium voltage to various transformers, where the voltage is stepped down to a low voltage and is provided to a number of loads, such as homes, businesses, etc.

Periodically, faults occur in the distribution network as a result of various things, such as animals touching the lines, lightning strikes, tree branches falling on the lines, vehicle collisions with utility poles, etc. Faults may create a short-circuit that reduces the load on the network, which may cause the current flow from the substation to significantly increase, for example, up to 2500 amps, along the fault path. This amount of current causes the electrical lines to significantly heat up and possibly melt, and also could cause mechanical damage to various components in the substation and in the network. Many times the fault will be a temporary or intermittent fault as opposed to a permanent or bolted fault, where the thing that caused the fault is removed a short time after the fault occurs, for example, a lightning strike, where the distribution network will almost immediately begin operating normally.

Each lateral line is usually protected by a fuse that creates an open circuit when the temperature of a fuse element goes above a certain temperature as a result of the high fault current, which disconnects power from the loads being serviced by that lateral line. A blown fuse requires a worker from the service or utility company to identify which fuse has blown, and replace it after the fault has been removed or cleared. However, fuses are generally not used on the feeder lines because they typically service many lateral lines. Therefore, reclosers or other types of switching devices or breakers are typically employed at the substation and at certain intervals along the feeder lines that include sensing and monitoring equipment and devices that detect high fault current and automatically cause an interrupter switch to open to prevent current flow downstream of the recloser.

The various breakers, reclosers, fuses, etc. referred to above are usually coordinated relative to each other to provide efficient over-current or fault current protection. Traditional over-current coordination generally requires each device to wait for certain ones of the downstream devices to open first to clear the fault. Because a recloser cannot discriminate between a fault on the feeder line and a fault on a lateral line, it needs to wait until the fuses have had an opportunity to clear the fault even though the fault may be on the feeder line. To accomplish this, the fuses will usually have a time-current characteristic (TCC) curve that is faster than the TCC curve of the reclosers, where the TCC curve defines how quickly the particular device will be opened for a particular fault current level. Therefore, while a recloser is waiting for its TCC time period to pass, the high fault current on the feeder line may be causing mechanical stresses and damage on various equipment that is exposed to the current. Thus, if a fault is on the feeder line, only a recloser can clear the fault and it should do so as fast as possible to reduce stresses on equipment and improve other protections. Hence, it would be beneficial if the recloser was able to determine whether a fault was on the feeder line or a lateral line, and open quicker than it normally would if it had to wait to determine if a fuse responded to the fault current.

SUMMARY

The present disclosure describes a method for determining whether a fault in an electrical power distribution network is on a feeder line or a lateral line so as to allow an upstream recloser, or circuit breaker, on the feeder line to immediately open in response to the fault if it determines the fault is on the feeder line. The method includes measuring a current and voltage on the feeder line at the upstream recloser or the circuit breaker, identifying that a fault current is present indicating a fault on the feeder line or the lateral line, and determining a fault voltage at a fault location. The method measures a downstream voltage on the feeder line at a downstream recloser during the fault and transmits the downstream voltage to the upstream recloser. The method can determine that the fault is on the feeder line or the lateral line by determining whether the fault voltage is approximately the same as the downstream voltage, where if the fault and downstream voltages are approximately the same the fault is on the feeder line and if the fault and downstream voltages are not approximately the same the fault is on the lateral line. Alternately, the method can determine a first distance from the upstream recloser to the fault location using the fault voltage and determine a second distance from the upstream recloser to a last location of the fault current on the feeder line using the downstream voltage, and determine that the fault is on the feeder line or the lateral line by comparing the first and second distances, where if the first and second distances are the same or nearly the same the fault is on the feeder line and if the first and second distances are not the same the fault is on the lateral line. The method opens a switch in the upstream recloser or circuit breaker if it is determined that the fault is on the feeder line.

Additional features of the embodiments will become apparent from the following description and appended claims, taken in conjunction with the accompanying drawings.

BRIEF DESCRIPTION OF THE DRAWING

FIG. 1 is a simplified schematic illustration of an electrical power distribution network.

DETAILED DESCRIPTION OF THE EMBODIMENTS

The following discussion of the embodiments directed to a method for determining whether a fault is on a feeder line or a lateral line in an electrical power distribution network is merely exemplary in nature, and is in no way intended to limit the invention or its applications or uses.

FIG. 1 is a schematic type diagram of an electrical power distribution network 10 including an electrical substation 12 that steps down high voltage power from a high voltage power line (not shown) to medium voltage power, a three-phase feeder line 14 that receives a medium voltage power signal from the substation 12, and a lateral line 16 that receives the medium voltage power signal from the feeder line 14. The medium voltage power signal is stepped down to a low voltage signal by a number of transformers (not shown) strategically positioned along the lateral line 16, and the low voltage signal is then provided to a number of loads 20 represented here as homes.

The network 10 includes a number of reclosers of the type referred to above provided at certain intervals along the feeder line 14. In this example, the network 10 includes an upstream recloser 24 and a downstream recloser 26, where the upstream recloser 24 measures the medium voltage signal from the substation 12 on the feeder line 14 before the downstream recloser 26. A number of utility poles 40 are provided along the feeder line 14, where the lateral line 16 is connected to one of the poles 40 and the reclosers 24 and 26 would be mounted on a certain one of the poles 40. The recloser 24 includes a relay or interrupter switch 30 for opening and closing the recloser 24 to allow or prevent current flow therethrough on the feeder line 14. The recloser 24 also includes a sensor 32 for measuring the current and voltage of the power signal propagating on the feeder line 14, a controller 34 for processing the measurement signals and controlling the position of the switch 30, and a transceiver 36 for transmitting and receiving data and messages to and from a control facility (not shown) and/or other reclosers and components in the system 10. The recloser 26 would include the same or similar components as the recloser 24. The configuration and operation of reclosers of this type are well understood by those skilled in the art.

The lateral line 16 includes a fuse 38 positioned between the feeder line 14 and the first load 20 on the lateral line 16 proximate to a tap location where the lateral line 16 is connected to the feeder line 14. The fuse 38 is an independent electrical device that is not in communication with other components or devices in the network 10, where the fuse 38 creates an open circuit if an element within the fuse 38 heats up above a predetermined temperature as a result of high fault current so as to prevent short-circuit faults on the lateral line 16 from affecting other parts of the network 10.

FIG. 1 shows a fault location 18 on the feeder line 14 at the tap location where the lateral line 16 is connected to the feeder line 14, a fault location 28 on the feeder line 14 between the reclosers 24 and 26, and a fault location 22 on the lateral line 16, where all of the fault locations are downstream of the recloser 24 and upstream of the recloser 26. As mentioned above, the recloser 24 would not be able to determine whether the fault is on the lateral line 16 or on the feeder line 14, just that there is a fault somewhere downstream of the recloser 24. Therefore, in traditional over-current protection schemes, the recloser 24 would be configured to wait some predetermined delay time after detecting a high fault current to give the fuse 38 an opportunity to blow if the location of the fault is on the lateral line 16 so that the recloser 24 does not prevent power from being provided to other lateral lines downstream of the recloser 24.

The electrical path of a fault current includes all of the electrical wires and conductors between the substation 12 and the fault location. Along this fault path during the high fault current, the voltage of the power signal on the line drops gradually from the substation 12 to the fault location, where the rate of voltage drop depends on the magnitude of the fault current and the impedance of the line, and where the voltage on the line at the fault location meets certain conditions, for example, the line-to-ground voltage is zero for line-to-ground faults and the line-to-line voltage is zero for line-to-line faults. From this understanding, fault location schemes have been devised in the art for calculating the possible locations of a fault on an electrical line by using the known impedance of the line and the voltage and current measurements provided by the reclosers along the fault path. It is noted that the impedance of the line 14 or 16 may be different between the poles 40 depending on a number of factors, such as wire material, wire diameter, span length, height of the utility poles, etc., or the impedance could be the same for all of the spans between the poles 40. The reclosers are able to communicate with each other so that the first recloser upstream of the fault is known to be the last recloser where the fault current and voltage can be measured, where that recloser can be opened so that power is still able to be provided upstream of it.

For the example shown in FIG. 1, the recloser 24 is the first upstream recloser from the fault. Since the impedance of the feed line 14 and the lateral line 16 are known for each span of the lines 14 and 16 between the utility poles 40 downstream of the recloser 24, the voltage and current can be estimated at each of the utility poles 40 using the measured voltage and current at the recloser 24, where the voltage will continue to decrease to the fault location, where it will be at or near zero. Specifically, since the voltage Vo and the current Io are measured at the recloser 24, and the impedance Z of the feeder line 14 and the lateral line 16 are known in each span between the utility poles 40, the voltage at each utility pole 40 can be estimated as $V_1 = V_0 - Z_1 I_0$, $V_2 = 1 - Z_2 I_0$, $V_3 = V_2 - Z_3 I_0$, etc., where $V_1$ is the estimated voltage at the first utility pole downstream from the recloser 24, $V_2$ is the estimated voltage at the second utility pole downstream of the recloser 24, $V_3$ is the estimated voltage at the third utility pole downstream of the recloser 24, $Z_1$ is the impedance of the feeder line 14 between the recloser 24 and the first utility pole, $Z_2$ is the impedance of the feeder line 14 between the first and second utility poles, and $Z_3$ is the impedance of the feeder line 14 between the second and third utility poles. Thus, the voltage is estimated at each of the poles 40 in this manner until the estimated voltage begins to increase. Since the recloser 24 knows the locations of the utility poles 40 and their distances from the recloser 24, the location of the fault can be determined. It is noted that the impedance used in these calculations need not be overly precise because there is a comparison between two values that are computed based on the same impedance.

The above method for determining the fault location assumes that the fault is a direct short-circuit and has no impedance. However, a typical fault will not cause a direct short-circuit, and thus there will be some impedance at the fault location that is all resistive, which acts to generate heat and create a voltage drop. Reactive power Q can be calculated at the recloser 24 using the equation $Q_0=\text{imag}(I^*_0 V_0)$, where $I_0$ and $V_0$ are complex numbers, * is a conjugate operator, and imag is the imaginary part of a complex number. The reactive power Q can be estimated at each of the utility poles 40 based on the estimated voltage determined above, specifically $Q_1=\text{imag}(I^*_0 V_1)$, $Q_2=\text{iMag}(I^*_0 V_2)$, $Q_3=\text{iMag}(I^*_0 V_3)$, etc. Since $I_0$ is the fault current, the reactive power calculations are valid as long as the pole 40 for which the reactive power Q is calculated is upstream of the fault location. At the fault location, the reactive power Q is calculated as zero since the fault only draws real power, and downstream of the fault location, the reactive power Q becomes negative. Since the fault may not be directly at a pole location, the estimated location will be in the span between the last pole where the reactive power Q is positive and the first pole where the reactive power Q is negative.

For simplicity, the above discussion assumes that only one phase of the three-phase lines is faulted. The fault location method, however, is applicable for faults involving two or three phases. For example, with the voltage based approach, a phase-to-phase fault would be identified at the point where the phase-to-phase voltage is at or near zero. With the reactive power based approach, a phase-to-phase fault would be identified at the point where the sum of reactive power across all faulted phases is zero or negative.

Once the span between two of the utility poles 40 is identified as the location where the fault has occurred, then the following equation can be used to identify where in that span the fault actually is, where Q is the estimated reactive power at the utility pole 40, I is the fault current, X is the inductive component of the line impedance, and l is the distance from the recloser 24 to the fault location.

$$Q=lX_{line/mile}I^2$$

Because the recloser 24 does not know whether the fault is on the feeder line 14 or the lateral line 16, or on some other line, the discussion above may identify multiple possible fault locations on the various lines. However, a proximate distance from the recloser 24 to the fault location can be provided regardless of what line the fault is on. Further, the voltage measured by the downstream recloser 26 will be approximately the same as the voltage at the location where the fault is occurring if it is on the feeder line 14 or the voltage at the location that the fault current last occurred on the feeder line 14 if the fault is on the lateral line 16. In other words, as the fault current travels to the fault from the substation 12 the voltage drop at each of the utility poles 40 will be significant, but once the utility poles 40 are off of the fault path, then the voltage drop at each of the utility poles 40 will be minimal because the fault current is no longer occurring. Therefore, the downstream recloser 26 can provide a proximate voltage measurement at the fault location if it is on the feeder line 14 or a proximate voltage measurement where the lateral line 16 connects to the feeder line 14 if the fault is on the lateral line 16.

The voltage measured by the downstream recloser 26 is transmitted to the upstream recloser 24, and since the upstream recloser 24 has estimated the voltages at each of the utility poles 40 it can compare the voltage it receives from the recloser 26 with those voltages to determine what utility pole 40 has that estimated voltage. Once the upstream recloser 24 knows which utility pole 40 has that estimated voltage value, it knows the distance from it to that utility pole, and thus also knows if that distance matches the distance to the fault location. If the distance to that utility pole 40 is different than the distance from the recloser 24 to the fault location, then the recloser 24 knows that the fault is on the lateral line 16.

Synchronized measurements from the downstream recloser 26 so that a phasor comparison can be made will lead to better performance. However, the fault location detection method of this disclosure does not assume synchronized measurements. In the absence of synchronized measurements, only the voltage magnitude can be compared. Alternatively, the angle difference can be estimated by comparing all three-phase voltages.

The ability of the method as described to determine whether the fault is on the feeder line 14 or the lateral line 16 can be illustrated by the following scenarios. In a first scenario, the fault is on the feeder line 14, for example, at the fault location 18 or 28, which is a location where it is desirable to open the switch 30 as quickly as possible after the fault is detected, and not wait for the time to determine if the fuse 38 is going to blow. In this scenario, the upstream recloser 24 can estimate the voltage at the fault location in the manner discussed above, and by knowing the location of the utility pole 40 where that fault voltage occurs the recloser 24 can determine the distance from the recloser 24 to the fault location. The downstream recloser 26 transmits the voltage measurement during the fault to the upstream recloser 24. The upstream recloser 24 can use the voltage measurement from the downstream recloser 26 to determine where on the feeder line 14 the upstream recloser 24 estimated that voltage, and determine a distance from the recloser 24 to that location by knowing which utility pole 40 had that voltage estimation. The upstream recloser 24 can determine that the distance from the recloser 24 to the fault location is the same as the distance from the recloser 24 to the location identified by the voltage from the recloser 26. The upstream recloser 24 thus can open the switch 30 without waiting for the fuse 38 to blow.

In a separate embodiment, the upstream recloser 24 can compare the estimated voltage at the fault location to the voltage sent by the downstream recloser 26, which should be the same in this scenario. If the voltages are the same, the upstream recloser 24 can open the switch 30 without waiting for the fuse 38 to blow.

For the scenario where the fault is on the lateral line 16 at, for example, the fault location 22, it is desirable for the upstream recloser 24 to maintain the switch 30 closed, and let the fuse 38 blow so that loads downstream of the lateral line 16 will not be affected by opening of the switch 30. In this situation, the upstream recloser 24 determines the distance from the upstream recloser 24 to the fault location 22 in the manner discussed above, but does not yet know that the fault is on the lateral line 16. The downstream recloser 26 measures the voltage on the feeder line 14, which is about the same as the voltage at the last point where the fault path was still on the feeder line 14, i.e., at the tap location to the lateral line 16. If the voltage measured by the downstream recloser 26 does not match the estimated voltage at the fault location 22, then the upstream recloser 24 knows that the fault is on the lateral line 16. Alternately, or in addition thereto, the upstream recloser 24 can use the voltage measurement from the downstream recloser 26 to identify the distance from the upstream recloser 24 to the tap location for the lateral line 16, and compare that distance to the distance to the fault location 22, where if the two distances do not match, then the upstream recloser 24 knows that the fault is on the lateral line 16. Therefore, the recloser 24 will not open the switch 30, but will wait for the fuse 38 to be blown.

It is noted that the downstream recloser 26 can be the recloser as described, a normally open protection device including switches and sectionalizers, or any other non-protective device with voltage measurement capability. That device needs to be able to measure three-phase voltages, although the measurements need not be from the same location. That device also needs to be able to communicate with the upstream recloser 24.

It is further noted that if the fault is very close to the lateral line 16 it may not be possible to discriminate with high certainty whether the fault is upstream or downstream of the fuse 38, which depends on the accuracy of the voltage and current measurements. A very low percentage of lateral faults are expected to occur very close to the fuse 38. The percentage of feeder line faults happening next to the fuse 38 depends on the density of the network, and the nature of the fault. In this case, the operator has the option to wait for the fuse 38 to blow or operate instantaneously. The first option will provide the same performance for these faults as if this method were not employed. The second option will provide much better performance for all feeder line faults, while sacrificing the performance only for the very few lateral faults that are very close to the feeder line.

A particular power distribution network may not have the location of every utility pole and line impedance between every two utility poles. Instead, only the average of the line impedance for the feeder line 14 may be available. It is possible to add artificial utility poles along the feeder line 14 and use the pole-by-pole approach discussed above. However, it is also possible to find a distance to the fault in a single calculation, which can be used to provide the distances discussed above.

The foregoing discussion discloses and describes merely exemplary embodiments. One skilled in the art will readily recognize from such discussion and from the accompanying drawings and claims that various changes, modifications and variations can be made therein without departing from the spirit and scope of the disclosure as defined in the following claims.

What is claimed is:

1. A method for identifying whether a fault is located on a feeder line or a lateral line in an electrical power distribution network, said network including a power source, an upstream switching device on the feeder line, a downstream switching device downstream from the upstream switching device relative to power flow from the power source on the feeder line, and a fuse in the lateral line, said lateral line being coupled to the feeder line at a tap location, said upstream and downstream switching devices being operable to allow or prevent the power signal from flowing through the switching device, the method comprising:

measuring a current and voltage on the feeder line in the upstream switching device;

identifying that a fault current is present indicating a fault on the feeder line or the lateral line in the upstream switching device;

determining in the upstream switching device a fault location of the fault by identifying a fault voltage using the measured current and voltage;

measuring a downstream voltage on the feeder line in the downstream switching device during the fault;

transmitting the downstream voltage from the downstream switching device to the upstream switching device;

determining that the fault location is on the feeder line or the lateral line based on the downstream voltage and the fault voltage; and opening a switch in the upstream switching device if it is determined that the fault location is on the feeder line.

2. The method according to claim 1 wherein determining a fault location includes estimating the voltage during the fault at each of a plurality of utility poles downstream of the upstream switching device and upstream of the fault location.

3. The method according to claim 2 wherein determining a fault location includes identifying the fault location as the location where the fault voltage is zero or approximately zero.

4. The method according to claim 3 wherein determining a fault location includes determining the fault location as the location where a reactive power that is determined based on the estimated voltage at the fault location becomes zero.

5. The method according to claim 1 wherein determining that the fault location is on the feeder line or the lateral line includes determining whether the fault voltage is approximately the same as the downstream voltage, where if the fault and downstream voltages are approximately the same the fault location is on the feeder line and if the fault and downstream voltages are not approximately the same the fault location is on the lateral line.

6. The method according to claim 1 further comprising determining a first distance from the upstream switching device to the fault location using the fault voltage and determining a second distance from the upstream switching device to a last location of the fault current on the feeder line using the downstream voltage, wherein determining that the fault location is on the feeder line or the lateral line includes comparing the first and second distances where if the first and second distances are the same or nearly the same the fault location is on the feeder line and if the first and second distances are not the same the fault location is on the lateral line.

7. The method according to claim 1 wherein the upstream and downstream switching devices are reclosers.

8. The method according to claim 1 wherein the power source is an electrical substation and the electrical power distribution network is a medium voltage power distribution network.

9. A method for identifying whether a fault is located on a feeder line or a lateral line in a medium voltage power distribution network, said network including a substation, an upstream recloser on the feeder line, a downstream recloser downstream from the upstream recloser relative to power flow from the substation on the feeder line, and a fuse in the lateral line, said lateral line being coupled to the feeder line at a tap location, said upstream and downstream reclosers being operable to allow or prevent the power signal from flowing through the recloser, the method comprising:

measuring a current and voltage on the feeder line in the upstream recloser;

identifying that a fault current is present indicating a fault on the feeder line or the lateral line in the upstream recloser;

determining in the upstream recloser a fault location of the fault by identifying a fault voltage using the measured current and voltage;

determining in the upstream recloser a first distance from the upstream recloser to the fault location using the fault voltage;

measuring a downstream voltage on the feeder line in the downstream recloser during the fault;

transmitting the downstream voltage from the downstream recloser to the upstream recloser;

determining in the upstream recloser a second distance from the upstream recloser to a last location of the fault current on the feeder line using the downstream voltage;

determining that the fault location is on the feeder line or the lateral line by comparing the first and second distances where if the first and second distances are the same or nearly the same the fault location is on the feeder line and if the first and second distances are not the same the fault location is on the lateral line; and opening a switch in the upstream switching device if it is determined that the fault location is on the feeder line.

10. The method according to claim 9 wherein determining a fault location includes estimating the voltage during the fault at each of a plurality of utility poles downstream of the upstream recloser and upstream of the fault location.

11. The method according to claim 10 wherein determining a fault location includes identifying the fault location as the location where the fault voltage is zero or approximately zero.

12. The method according to claim 11 wherein determining a fault location includes identifying the fault location as the location where a reactive power determined based on the estimated voltage at the fault location goes negative.

13. A system for identifying whether a fault is located on a feeder line or a lateral line in an electrical power distribution network, the network including a power source, an upstream switching device on the feeder line, a downstream switching device downstream from the upstream switching device relative to power flow from the power source on the feeder line, and a fuse in the lateral line, the lateral line being coupled to the feeder line at a tap location, the upstream and downstream switching devices being operable to allow or prevent the power signal from flowing through the switching device, the system comprising:

a voltage sensor and a current sensor on the feeder line in the upstream switching device having a voltage output corresponding to a feeder voltage and a current output corresponding to a feeder current;

a fault detection processor couple to the current sensor, the fault detection processor configured to identify that a fault current is present on the feeder line or on the lateral line in the upstream switching device;

the upstream switching device configured to identify a fault location of the fault by identifying a fault voltage at least using the voltage output;

a downstream voltage sensor on the feeder line in the downstream switching device, the downstream voltage sensor configured to provide a downstream voltage output to the upstream switching device; wherein the fault detection processor is configured to determine that the fault location is on the feeder line or the lateral line based on the downstream voltage and the fault voltage and to open a switch in the upstream switching device if it is determined that the fault location is on the feeder line.

14. The system according to claim 13 wherein the fault detection processor is further configured to estimate the voltage during the fault at each of a plurality of locations downstream of the upstream switching device and upstream of the fault location.

15. The system according to claim 14 wherein the fault detection processor is further configured to identify the fault location as the location where the fault voltage is zero or approximately zero.

16. The system according to claim 15 wherein the fault detection processor is further configured to determine the fault location as the location where a reactive power that is determined based on the estimated voltage at the fault location goes negative.

17. The system according to claim 13 wherein the fault detection processor is operably coupled on the feeder line or the lateral line to determine whether the fault voltage is approximately the same as the downstream voltage, where if the fault and downstream voltages are approximately the same the fault location is on the feeder line and if the fault and downstream voltages are not approximately the same the fault location is on the lateral line.

18. The system according to claim 13 wherein the fault detection processor is further configured to determine a first distance from the upstream switching device to the fault location using the fault voltage and a second distance from the upstream switching device to a last location of the fault current on the feeder line using the downstream voltage, and to determine that the fault location is on the feeder line or the lateral line by comparing the first and second distances where if the first and second distances are the same or nearly the same the fault location is on the feeder line and if the first and second distances are not the same the fault location is on the lateral line.

19. The system according to claim 13 wherein the upstream and downstream switching devices are reclosers.

20. The system according to claim 13 wherein the power source is an electrical substation and the electrical power distribution network is a medium voltage power distribution network.

* * * * *